US010187082B1

United States Patent
Tee et al.

(10) Patent No.: US 10,187,082 B1
(45) Date of Patent: Jan. 22, 2019

(54) SYSTEMS AND METHODS FOR GRAY CODING BASED ERROR CORRECTION IN AN ASYNCHRONOUS COUNTER

(71) Applicant: Marvell International Ltd., Hamilton (BM)

(72) Inventors: Luns Tee, Berkeley, CA (US);
Wanghua Wu, Santa Clara, CA (US);
Xiang Gao, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/812,797

(22) Filed: Nov. 14, 2017

Related U.S. Application Data (60) Provisional application No. 62/421,464, filed on Nov. 14, 2016.

(51) Int. Cl.
| | |
|---|---|
| *H03M 7/16* | (2006.01) |
| *H03M 13/03* | (2006.01) |
| *H03K 23/00* | (2006.01) |

(52) U.S. Cl.
CPC .......... *H03M 13/03* (2013.01); *H03K 23/005* (2013.01); *H03M 7/16* (2013.01); *G06F 2205/102* (2013.01)

(58) Field of Classification Search
CPC ...... H03M 13/03; H03M 7/16; H03K 23/005; G06F 2205/102
See application file for complete search history.

(56) References Cited

U.S. PATENT DOCUMENTS

| | | | | |
|---|---|---|---|---|
| 5,448,606 | A * | 9/1995 | Snelgrove | H03K 23/005 377/34 |
| 6,937,172 | B1 * | 8/2005 | Lowe | G06F 5/14 341/97 |
| 2003/0067401 | A1 * | 4/2003 | Yi | H03M 7/16 341/97 |
| 2005/0017753 | A1 * | 1/2005 | Clift | H03K 23/005 326/37 |
| 2005/0129167 | A1 * | 6/2005 | Heimbigner | H03K 19/215 377/34 |

* cited by examiner

*Primary Examiner* — Syed Haider (57) ABSTRACT

Embodiments described herein provide a method for correcting a propagation delay induced error in an output of an asynchronous counter. An input clock is applied to the asynchronous counter. A gray-code count is generated by the asynchronous counter. The gray-code count is mapped to a binary count. An error component, indicative of a counting error induced by a propagation delay between the input clock and the binary count, is generated by taking an exclusive-OR operation over the gray-code count and the input clock. The error component is added to the binary count to generate an error-corrected binary count. The error-corrected binary count is output.

20 Claims, 10 Drawing Sheets

SYSTEMS AND METHODS FOR GRAY CODING BASED ERROR CORRECTION IN AN ASYNCHRONOUS COUNTER

CROSS-REFERENCE TO RELATED APPLICATION

This disclosure claims the benefit under 35 U.S.C. § 119(e) of U.S. Provisional Patent Application No. 62/421,464, filed Nov. 14, 2016, which is hereby incorporated by reference herein in its entirety.

FIELD OF USE

This disclosure relates to error correction in logic circuits, and specifically, to systems and methods for correcting an error in the output of an asynchronous counter due to propagation delays in the asynchronous counter.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

A counter is a logic circuit that is configured to output binary bits representing an incrementing integer at an edge of a clock signal. The counter usually includes one or more latch registers, e.g., D-latches, which are controlled by one or more clock signals. When all the D-latches in the counter are controlled by the same external clock signal, the counter is known as a synchronous counter. When only the first D-latch is controlled by an external clock, and all subsequent D-latches are controlled by the output of the preceding D-latch, the counter is known as an asynchronous counter. The asynchronous counter is also called a ripple counter because of the way the clock pulse "ripples" through the D-latches.

A multi-bit asynchronous counter is commonly used in integrated circuits to reduce power consumption relative to synchronous counters. As different latches in the asynchronous counter are not synchronized, gate propagation delays among the different latches in the circuit may limit the maximum input signal frequency and lead to counting errors when the counter output is sampled by another asynchronous clock.

SUMMARY

Embodiments described herein provide a method for correcting a propagation delay induced error in an output of an asynchronous counter. An input clock is applied to the asynchronous counter. A gray-code count is generated by the asynchronous counter. The gray-code count is mapped to a binary count. An error component, indicative of a counting error induced by a propagation delay between the input clock and the binary count, is generated by taking an exclusive-OR operation over the gray-code count and the input clock. The error component is added to the binary count to generate an error-corrected binary count. The error-corrected binary count is output.

In some implementations, whether a gate propagation delay within the asynchronous counter exists is determined based on a value of the error component. In response to determining that the error component has a value of one, it is determined that the gate propagation delay exists. The error component is then added to the binary count to correct the propagation delay.

In some implementations, the gray-code counter includes a plurality of serially connected stages of counters. A plurality of output bits are concatenated from the plurality of serially connected stages of counters during an instant clock period to form the first gray-code count. The exclusive OR operation is performed on the plurality of output bits and the input clock to generate the error component.

In some implementations, the gray-code count and the input clock are grouped as a concatenated gray-code count. The concatenated gray-code count is converted to a concatenated binary count. A least significant bit from the concatenated binary count is designated as the error component. Remaining bits from the concatenated binary count excluding the least significant bit are designated as the binary count.

In some implementations, the gray-code counter includes a plurality of serially connected stages of counters. An estimate of a propagation delay among the plurality of serially connected stages of counters is obtained based on a number of the plurality of serially connected stages of counters. Whether the propagation delay is longer than a period of the input clock is determined when a single edge of each input clock cycle is used to trigger the plurality of serially connected stages of counters. Whether the propagation delay is longer than a half of the period of the input clock is determined when both of a rising edge and a falling edge of each input clock cycle are used to trigger the plurality of serially connected stages of counters.

In some implementations, in response to determining that the propagation delay is longer than the period of the input clock when the single edge of each input clock cycle is used to trigger the plurality of serially connected stages of counters, the plurality of serially connected stages of counters are segmented into multiple groups of stages of counters. A propagation delay within each group of stages of counters is smaller than the period of the input clock.

In some implementations, for each group of stages of counters, a respective gray-code count is generated by concatenating a bit corresponding to a last output in the respective group of stages of counters and bits corresponding to outputs from other stages in the respective group of stages of counters. The respective gray-code count is mapped to a respective binary count. A respective error component, indicative of a respective counting error induced by a respective propagation delay between a respective input and a respective output of the group of stages of counters, is generated by taking an exclusive-OR operation over all bits of the respective gray-code count and the respective input clock that is input to the respective group of stages of counters.

In some implementations, a respective error-corrected binary count is generated by adding the respective error component to the respective binary count. All respective error-corrected binary counts from the multiple groups of stages of counters are concatenated to form the error-corrected binary count corresponding to the plurality of serially connected stages of counters.

In some implementations, for respective groups of stages of counters, the respective gray-code count from the respective group of stages of counters and the input clock are grouped as a respective concatenated gray-code count. The respective concatenated gray-code count is converted to a respective concatenated binary count. A least significant bit from the concatenated binary count is designated as a respective error component. Remaining bits from the respective concatenated binary count excluding the least significant bit are designated as the respective binary count. All respective binary counts corresponding to all groups of stages of counters are concatenated to form the binary count. All respective error components corresponding to all groups of stages of counters are concatenated to form the error component.

In some implementations, a voltage-controlled oscillator (VCO) generated clock signal is fed as the input clock. The input clock and the gray-code count from the gray-code counter are sampled, via a register, based on a reference clock. The sampled gray-code count from the register and the sampled input clock are used for error correction to generate the error-free binary count.

Embodiments herein provide a system for correcting a propagation delay induced error in an output of an asynchronous counter. The system includes a gray-to-binary count converter. The gray-to-binary count converter is configured to receive a gray-code count generated by the asynchronous counter, wherein the asynchronous counter is operated by an input clock. The gray-to-binary count converter is configured to map the gray-code count to a binary count. The system further includes an exclusive OR gate configured to perform an exclusive-OR operation over the gray-code count and the input clock to generate an error component indicative of a counting error induced by a propagation delay between the input clock and the binary count. The system further includes an adder to generate an error-corrected binary count by adding the error component to the binary count.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for gray coding based error correction in asynchronous counters.

A gray code is an encoding of natural numbers in a way such that adjacent numbers have a single digit difference of one. For example, two-bit gray codes include 00, 01, 11 and 10, which are mapped to binary counts 00, 01, 10 and 11, respectively. For another example, three-bit gray codes include 000, 001, 011, 010, 110, 111, 101, 100, which are mapped to binary counts 000, 001, 010, 011, 100, 101, 110 and 111, respectively. A gray code counter is a counter that generates an output of incrementally increased gray codes at the edge of the input clock signal, instead of an incrementally increased binary count. As only one bit is toggled at each clock cycle, the gray code counter consumes much less power, and can be more robust for distribution over a long distance on a sizable circuit area than a binary counter of the equivalent size, e.g., with the same number of latches. Embodiments described herein use a gray code counter to detect propagation delay induced counting error, and then recover a correct binary count based on a parity check of the output bits and the input clock signal, e.g., by taking an exclusive-OR operation between the output bits and the input clock signal to generate an error component indicative of the propagation delay induced counting error.

Figure 1:
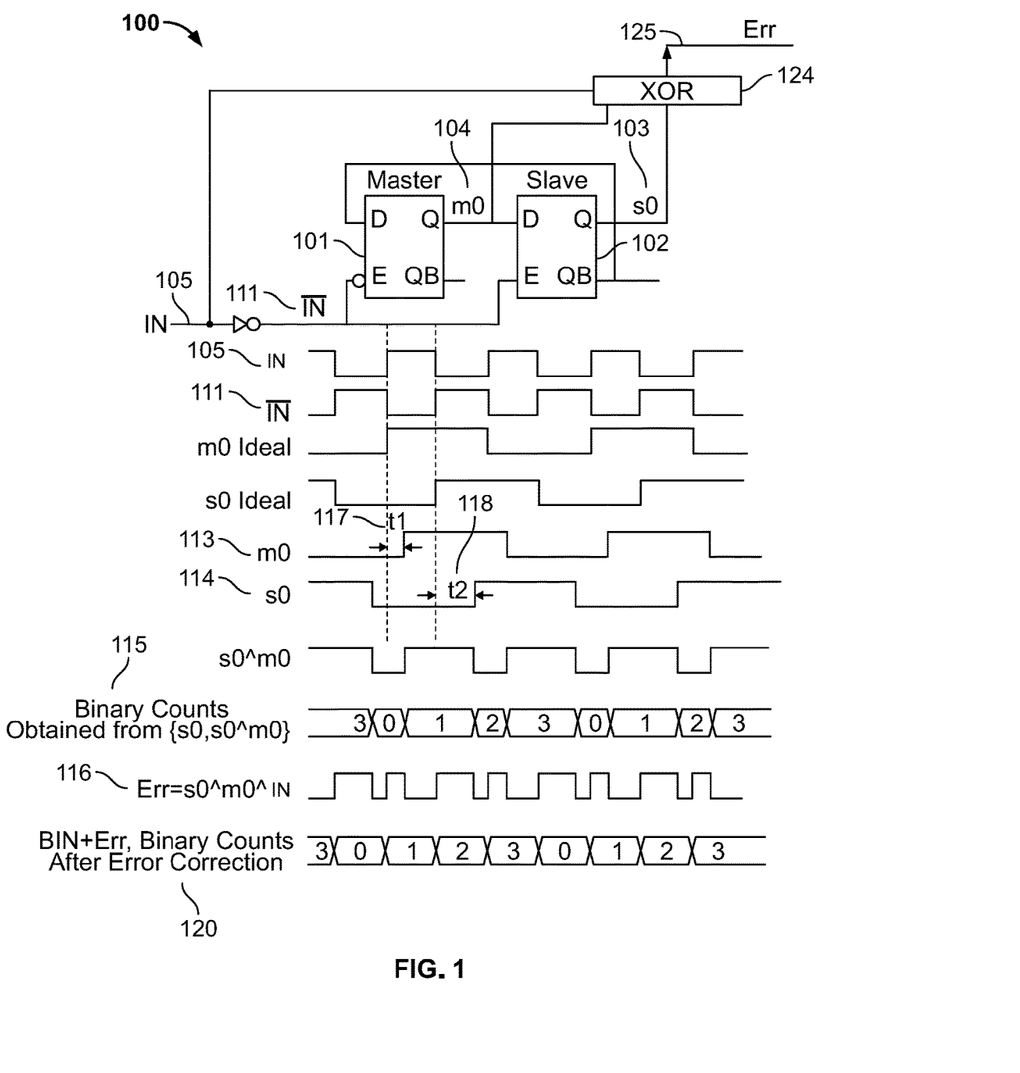
FIG. 1 is a block diagram illustrating an example one-bit ripple counter with error correction and the corresponding input/output signals, according to some embodiments described herein.

FIG. 1 is a block diagram illustrating an example one-bit ripple counter 100 with error correction and the corresponding input/output signals, according to some embodiments described herein. The one-bit ripple counter 100 is formed by two gated D-latches, e.g., a master latch 101 and a slave latch 102. An input clock 105 is fed to the master latch 101 and the slave latch 102, and the input clock and the inverse of the input clock are illustrated at waveforms 111 and 112. The master and slave outputs s(0) 103 and m(0) 104 form a two-bit gray code {s(0), m(0)}, where "{ }" denotes the concatenation of s(0) and m(0). Either s(0) 103 or m(0) 104 is sufficient for the one-bit counter 100, and using both s(0) and m(0) provides redundancy.

When the one-bit counter 100 is operated in an ideal scenario, e.g., when there is little or no propagation delay along the master latch 101 and the slave latch 102, the XOR of s(0) and m(0) equals the value of the input clock 105 during a clock period of the input clock 105. Thus, the input clock signal 105 can be recovered from both of the respective outputs of the master latch 101 and the slave latch 102 when there is no propagation delay between the master latch 101 and the slave latch 102.

However, when the XOR of s(0), m(0) and the input clock equals one, e.g., the output 125 of XOR gate 124 is one, meaning XOR(s(0), m(0)) no longer equals the input clock, an error has occurred when signals propagates through the master latch 101 and the slave latch 102. For example, the error can be caused by a propagation delay from the master latch 101 and the slave latch 102, e.g., as shown at 117, the master output m(0) experiences a propagation delay $t_1$ (e.g., see 117) as the master latch 101 takes time to react to the edge of the input clock 105, shown at waveform 113. Similarly, the slave output s(0) experiences a propagation delay $t_2$ (e.g., see 118) as the slave latch 102 takes time to react to the edge of the input clock 105, shown at waveform 114. Due to the delays $t_1$ and $t_2$, the resulting binary count 115, obtained as {s(0), s(0)^m(0)}, experiences a delay as well, e.g., the numbering change does not occur at the rising or falling edge of each clock cycle of the input clock 105 (shown at waveforms 111 and 112). For example, as shown at 115, the binary count starts at "0," changes from "0" to "1," changes from "1" to "2," and/or the like, at times that are after a delay from the triggering edge of the input clock.

As described above, an XOR gate 124 is disposed to receive the master output m0 104, the slave output s(0) 103 and the input clock 105. When the output 125 of the XOR gate 124 equals one, an error (delay) is detected, which error is equivalent to the output value of the XOR gate 124. When the output value 125, i.e., the error component, is added to the binary count 115, an error-corrected binary count 120 is generated. As shown at 120, the error-corrected binary count increases at the edges of the input clock 105.

Figure 2A:
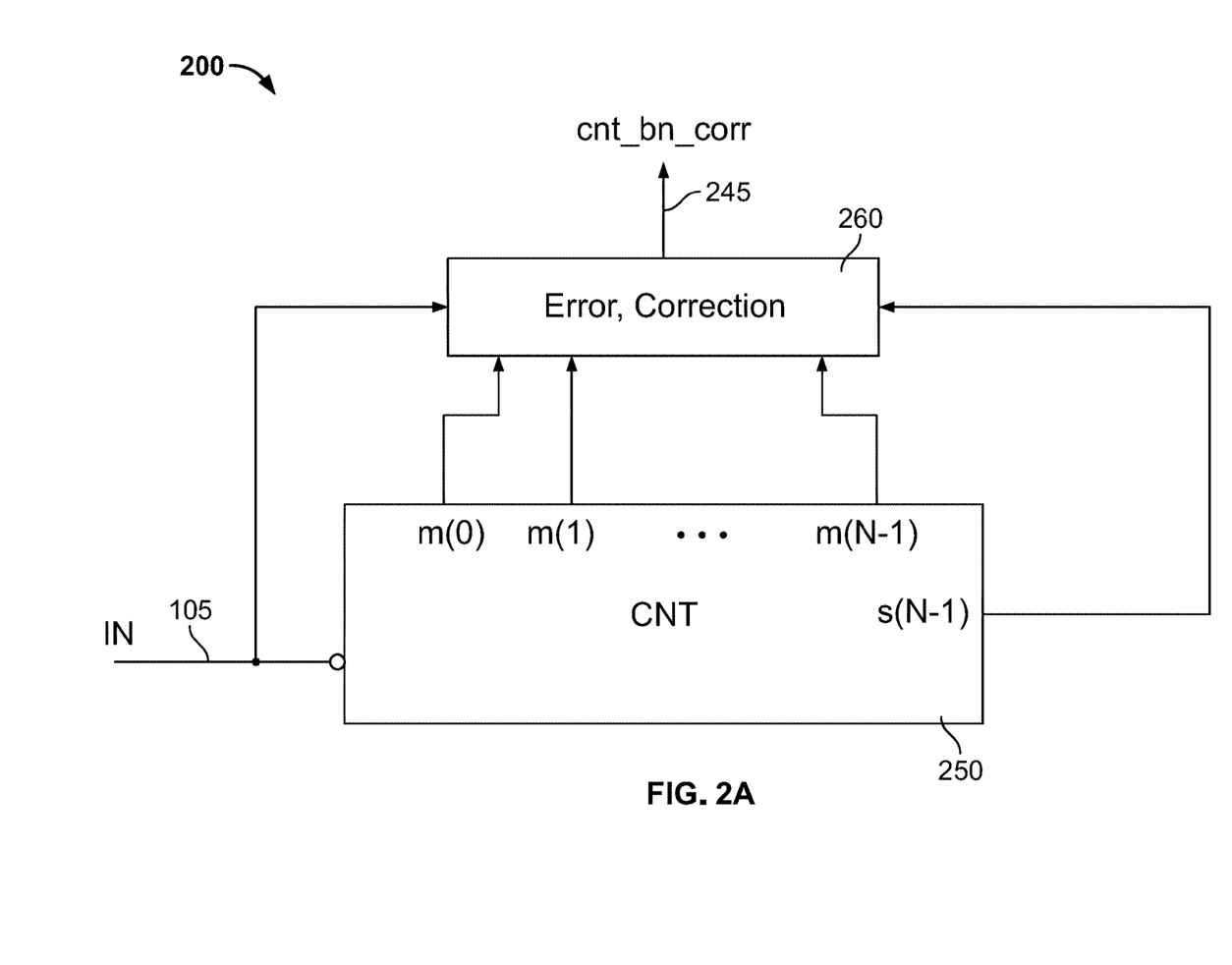
FIGS. 2A-2C are block diagrams illustrating an example multi-bit ripple counter operated with an error correction block, according to some embodiments described herein.

FIG. 2A is a block diagram illustrating an example multi-bit ripple counter operated with an error correction block, according to some embodiments described herein. The circuit 200 includes a N-bit counter 250, which receives an input 105 (similar to 105 in FIG. 1) and outputs gray code bits m(0), m(1), ..., m(N−1), s(N−1). The output bits from the counter 250 are then fed into an error correction block 260, which also receives the input 105. The error correction block 260 is configured to generate an error-free binary count output 245, in other words the count increment of the binary count 245 is aligned with the triggering edges of the input clock 105. Circuit structures inside the counter 250 and the error correction block 260 are seen in FIG. 2B.

Figure 2B:
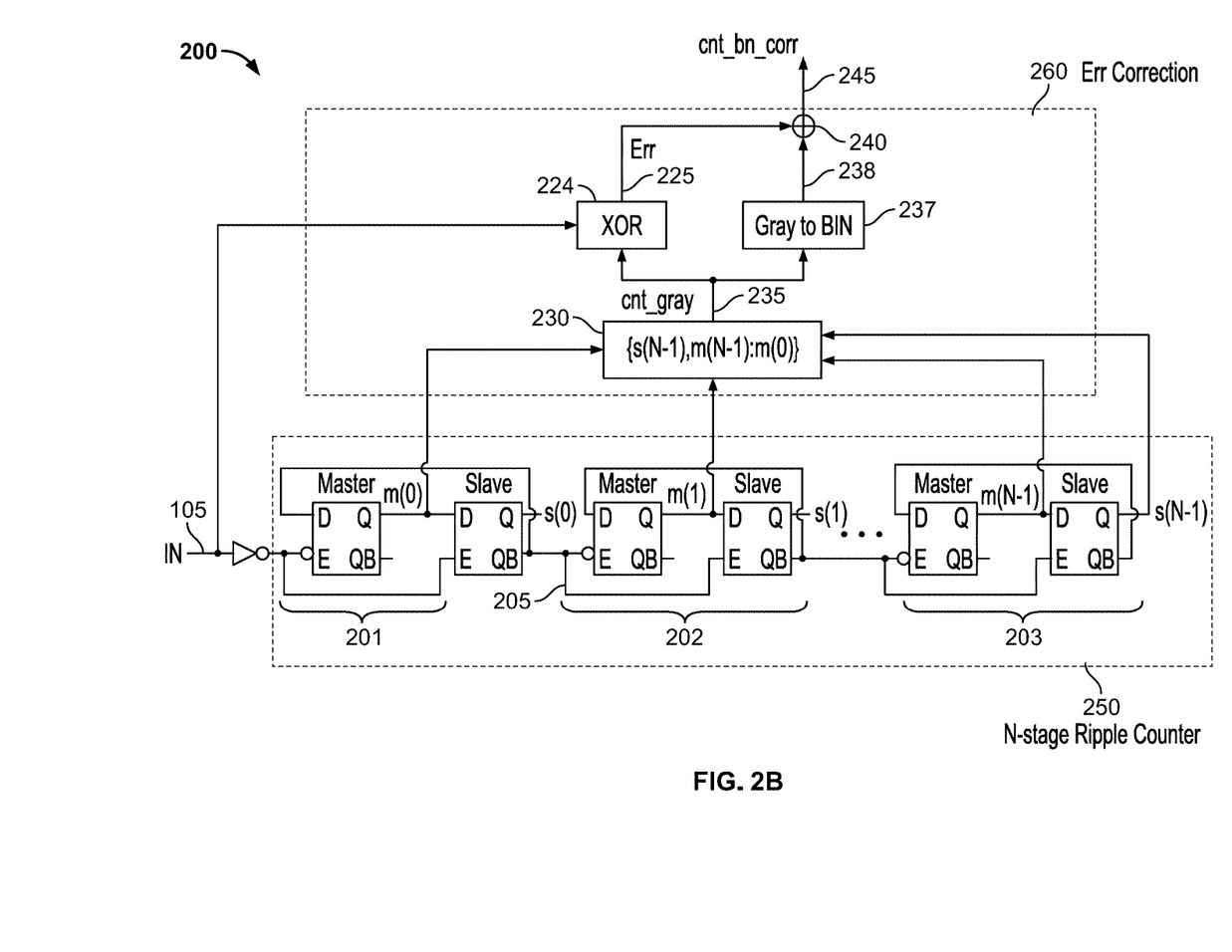

As seen in FIG. 2B, the N-stage multi-bit ripple counter 250 includes a number of serially connected pairs of a master latch and a slave latch elements, e.g., 201, 202 and 203, and/or the like. Each pair of the master latch and the slave latch elements is operated in a similar way as the one-bit counter 100 in FIG. 1. For the first pair 201 of the master latch and the slave latch, the inverse of an external input clock 105 is used as the clock signal. For subsequent pairs 202, 203 (and so on) of the master latch and the slave latch, the inverse of the output signal of the preceding slave latch, e.g., see 205, is used as the clock signal for the respective pair. The last slave output s(N−1), all the master outputs m(0), m(1) ... m(N−1) are sent to the error correction block 260.

The last slave output s(N−1), all the master outputs m(0), m(1) ... m(N−1) from the counter 250 are fed to the error correction block 260, and are grouped, e.g., at a concatenator 230, to form the gray code output 235. To correct error caused by propagation delay, an XOR gate 224 is configured to apply an exclusive OR operation on the gray code output 235 and the input clock 105 to generate an output 225 which corresponds to an error component. For example, for an N-bit ripple counter which contains N master and N slave stages, the N master outputs of the N stages are denoted as m[0:N−1], and the N slave outputs of the N stages are denoted as s[0:N−1], respectively. Thus, the corresponding gray code based on the outputs of the N-stage pairs of latches is cnt_gray [N:0]={s[N−1], m[N−1:0]}. The gray code is then mapped to a binary counterpart via the gray-to-binary module 237, in various known ways, e.g., based on a pre-defined mapping table, etc. Or the binary counterpart is calculated as, e.g., cnt_bn [N:0]=XOR (cnt_gray [N:0], (cnt_bn [N:0]>>1)), wherein the operator ">>" represents a bit shift. The error component 225 is calculated at the XOR gate 224, e.g., err=XOR (m(0), m(1), ... m(N−1), s(N−1), IN). The error free binary count 245 is calculated by adding the error component 225 and the binary count output 238 at the adder 240, e.g., cnt_bn_corr [N+1:0]=cnt_bn [N:0]+err. The error-free binary count 245 for the N-bit ripple counter 200 is then defined as equivalent to cnt_bn_corr [N:1]. The corrected LSB cnt_bn_corr[0] is identical to the input IN, and in some applications is considered the redundant bit and thus is omitted in the final binary count 245. The carry-out bit cnt_bn_corr[N+1] represents whether the correction of an error in the N-bit counter would affect subsequent counter stages after the N stages being corrected, and may be omitted in applications where there are no such subsequent stages.

Figure 2C:
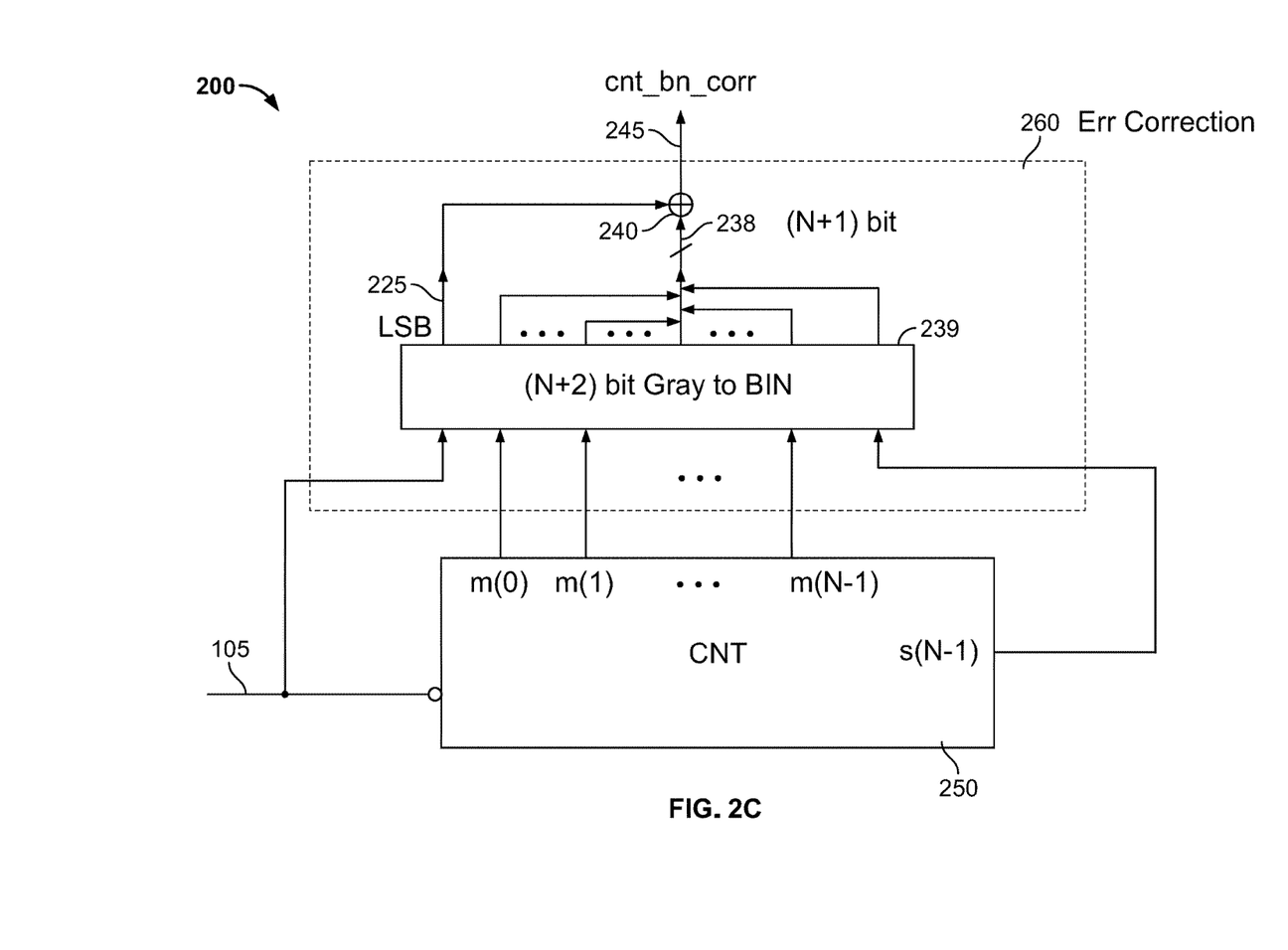

FIG. 2C provides a block diagram illustrating an alternative implementation of the error correction block 260, according to some embodiments described herein. The implementations of the error correction block 260 in FIG. 2B requires an XOR gate 224 that performs an exclusive or operation over a multi-bit input. To reduce processing burden on the logic gates, the exclusive OR operation can be carried out by a gray-to-binary converter. As shown at block 260, the output bits m(0), m(1), ... m(N−1), s(N−1) from the counter 250 and the input clock 105 can be treated as a (N+2)-bit gray code. The (N+2)-bit gray code is input to a (N+2)-bit gray-to-binary code converter 239, which is configured to convert the (N+2)-bit gray code into a binary count. The least significant bit (LSB) of the output binary word from the (N+2)-bit gray-to-binary code converter 239 corresponds to the error component 225, and the remaining bits of the output binary word correspond to a (N+1)-bit binary code 238. Thus, the error component 225 and the (N+1)-bit binary count 238 from the output of the (N+2)-bit gray-to-binary converter 239 are added at the adder 240 (similar to the adder 240 in FIG. 2B) to form the error-free binary count output 245.

As discussed in relation to FIG. 1, in some embodiments, the two latches 101 and 102 cause a propagation delay, and as a result, the counter output is not always aligned with the triggering edge of the input clock 105. In FIG. 2, as multiple stages of latches, e.g., 201, 202, 203, etc., are used, the propagation delay accumulates among the latches making up the counter circuit, thereby causing error of alignment of the count result relative to a triggering edge of the input clock 105. Thus, the error detection and correction based on the XOR gate 224 operation is applicable to the multi-bit ripple counter 200 only when the longest propagation delay from the input latch (e.g., the input of the master latch that receives the input clock 105) to the output latch (e.g., the last slave latch) is less than one half the input signal period (0.5 $T_{IN}$) of the input clock 105. For example, for an N-bit counter, if every stage of latches has a propagation delay of $T_{delay}$, then $T_{delay} < T_{IN}/2N$.

When the longest propagation delay is longer than the clock period (e.g., when a large number N of latches are cascaded such that $N \cdot T_{delay} > T_{IN}/2$), the XOR mechanism at 124 or 224 described in FIGS. 1 and 2B does not accurately mitigate the error in the counter. However, the cascaded stages of latches can be segmented into multiple groups, and within each group, as long as the accumulated propagation delay is less than the clock period, a similar error correction mechanism as described in FIGS. 1 and 2B can be applied to the latches within the respective group, as further described in FIG. 3.

Figure 3:
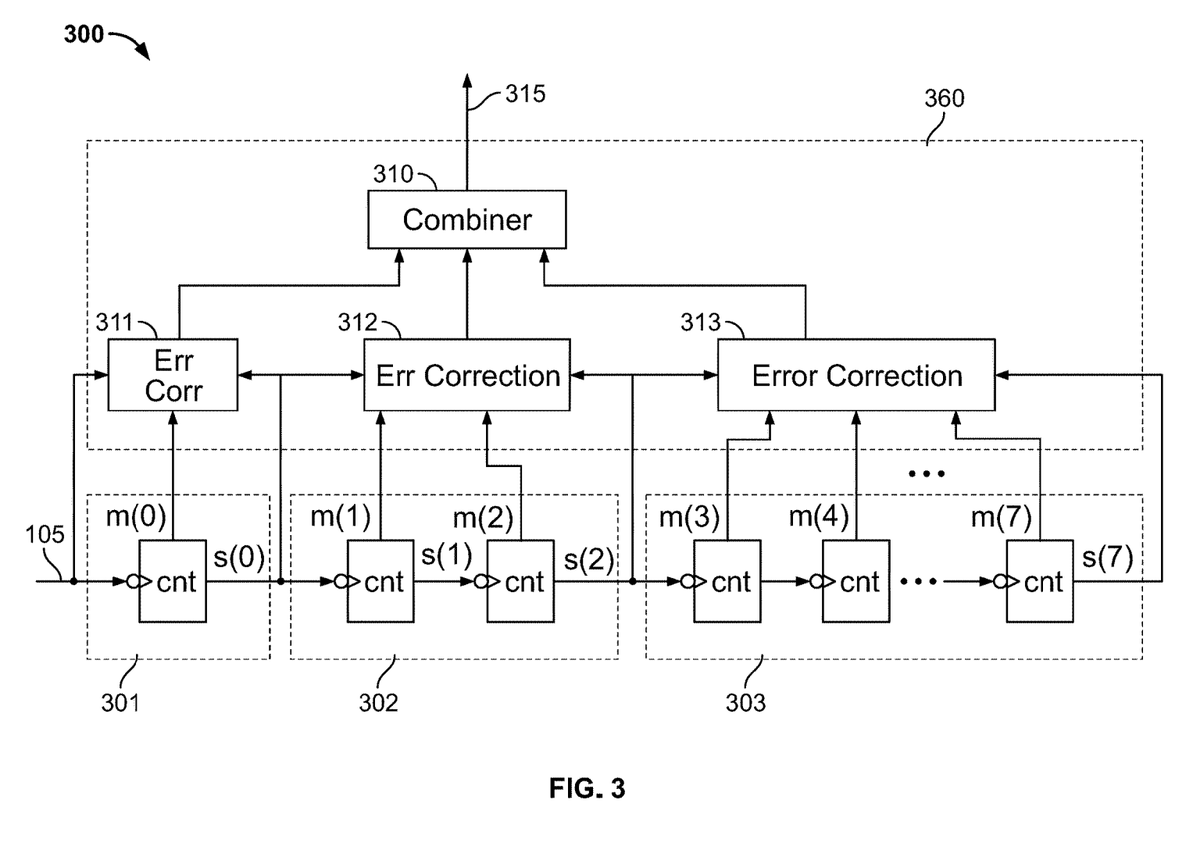
FIG. 3 is a block diagram illustrating an example multi-bit ripple counter with segmented error correction, according to some embodiments described herein.

FIG. 3 is a block diagram illustrating an example eight-bit ripple counter with segmented error correction, according to some embodiments described herein. The eight-bit ripple counter has eight stages, and each stage includes a master latch and a slave latch similar to 101 and 102 in FIG. 1. As the longest propagation delay within the eight-bit ripple counter may be greater than a clock period of the input clock 105, the eight stages of latches within the counter are segmented into three groups 301, 302 and 303. Each group of latches 301, 302 or 303 can be seen as an individual M-bit ripple counter. For example, the group 301 includes a one-bit counter (one stage, two latches); the group 302 includes a two-bit counter (two stages, four latches); and the group 303 includes a five-bit counter (five stages, the remaining ten latches). It is noted that the segmentation of groups 301, 302 and 303 are for illustrative purpose only. A different number of groups, or a different number of bits allocated to each group can be used. The bits allocated to each group can be the same or different per group, as long as the total propagation delay among the latches within each group satisfy the aforementioned condition (longest delay less than input signal period).

Thus, within the error correction block 360, error correction is performed for each group 301, 302 and 303 to obtain an error-free binary count. For example, group 301 is treated as a one-bit ripple counter, with the input signal 105 and output bits m(0) and s(0) being sent to an error correction block 311. The error correction block 311 is then configured to generate an error-free three-bit (with a carry-out bit and a redundant LSB) binary output, in a similar manner as discussed in FIG. 2B. Groups 302 and 303 are each treated as a two-bit ripple counter and a five-bit ripple counter, respectively. The input bit s(0) to group 302, and the output bits m(1), m(2) and s(2) from group 302 are all fed to an error correction block 312, which has a similar circuit structure as block 260 as illustrated in FIG. 2B. The error correction block 312 is then configured to generate an error-free four-bit (with a carry-out bit and a redundant LSB) binary output, in a similar manner as discussed in FIG. 2B. Similarly, the input bit s(2) and the output bits m(3), m(4), m(5), m(6), m(7) and s(7) from group 303 are fed to an error correction block 313, which is configured to generate an error-free seven-bit binary output (with a carry-out bit and a redundant LSB). The combiner 310 is configured to concatenate with overlap by addition, the three-bit output from the error correction 311, the four-bit output from the error correction block 312, and the seven-bit input from the error correction 313 to form an error-free nine-bit output 315. For example, as discussed in relation to FIGS. 1 and 2B, the LSB of the corrected binary count, e.g., bn_corr(0), derived from a ripple counter is usually treated as redundant with the prior stage. Therefore, when the output binary counts from the error correction 311, 312 or 313 include the redundant LSBs (in addition to the carry-out bits), e.g., the error correction block 311 outputs three bits, the error correction block 312 outputs four bits and the error correction block 313 outputs seven bits, the combiner 310 is configured to concatenate such that the redundant LSBs of group 302 and 303 are omitted and the carry-out bits of 301 and 302 overlap with the least-significant remaining bits of the subsequent groups, and the carry-out bit of group 303 (as there is no subsequent stage after group 303) is also omitted. In this way, the combiner 310 is configured to output the final corrected binary count of nine bits (including a redundant LSB).

In some embodiments, the error correction blocks 311-313 and the combiner 310 are implemented through logic gates such as an XOR gate similar to 124 and 224 in FIGS. 1 and 2B, etc. In some embodiments, operations relating to the error correction blocks 311-313 and the combiner 310 as described in FIG. 3 are implemented through programmable processing circuitry. For example, example pseudo-code to divide the eight-bit counter into groups takes a form similar to:

wire [2:0] cnt_gray_seg1={cnt_slave[0], cnt_master[0], clkIN};

wire [3:0] cnt_gray_seg2={cnt_slave[2], cnt_master[2:1], cnt_slave[0]};

wire [6:0] cnt_gray_seg3={cnt_slave[7], cnt_master[7:3], cnt_slave[2]};
. . .

For another example, example pseudo-code to correct the error in group 301 (e.g., to implement error correction 311) takes a form similar to:

wire [2:0] cnt_bn_seg1=cnt_gray_seg1^(cnt_bn_seg1>>1);
wire [2:0] cnt_bn_seg1_corrected=(cnt_gray_seg1>>1)+cnt_bn_seg1[0]; . . .

For another example, example pseudo-code to correct the error in group 302 (e.g., to implement error correction 312, omitting the redundant LSB) takes a form similar to:

wire [3:0] cnt_bn_seg2=cnt_gray_seg2^(cnt_bn_seg2>>1);
wire [2:0] cnt_bn_seg2_corrected=((cnt_bn_seg2>>1)+cnt_bn_seg2[0])>>1; . . .

For another example, example pseudo-code to correct the error in group 303 (e.g., to implement error correction 313, omitting both redundancy and carry-out bits) takes a form similar to:

wire [6:0] cnt_bn_seg3=cnt_gray_seg3^(cnt_bn_seg3>>1);
wire [4:0] cnt_bn_seg3_corrected=((cnt_bn_seg3>>1)+cnt_bn_seg3[0])>>1; . . .

For another example, example pseudo-code to concatenate binary counts (e.g., to implement concatenation at 310) takes a form similar to:

wire [8:0] CNT_BN=(cnt_bn_seg3_corrected<<4)+(cnt_bn_seg2_corrected<<<2)+cnt_bn_seg1_corrected; . . .

Figure 4:
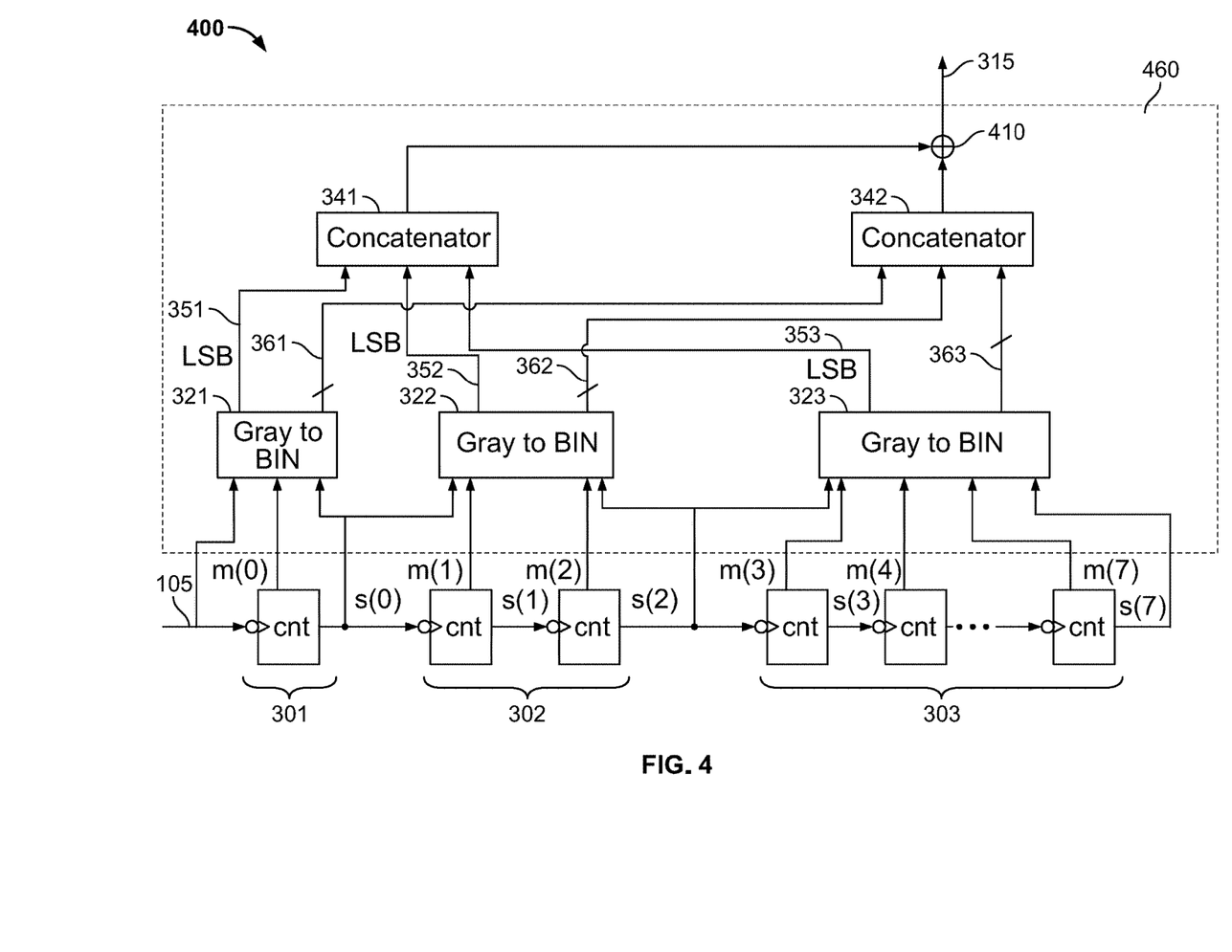
FIG. 4 is a block diagram illustrating an alternative implementation of an example multi-bit ripple counter with segmented error correction, according to some embodiments described herein.

FIG. 4 is a block diagram illustrating an alternative implementation of an example multi-bit ripple counter with segmented error correction, according to some embodiments described herein. Within each error correction block 311-313 that is configured to correct a propagation error in the output bits from each group 301-303 in FIG. 3, respectively, the gray code output bits from each group are first converted to a binary code, and then used to calculate an error component via an exclusive or operation. The error component is then added to the binary code to generate an error-free binary code for each of the group 302 or 303, before being concatenated together to generate the final nine-bit error-free binary code (including the carry-out bit as discussed in relation to FIG. 2B). In the circuit diagram 400, the steps for error correction can be performed reversely at the error correction block 460, based on an implementation similar to FIG. 2C. For example, for each group 301-303 respectively, an expanded gray-to-binary converter is used to generate an expanded binary count, with the LSB representing the respective error component, and the remaining bits equivalent to the respective binary count corresponding to the gray-code count. The binary codes and the error components for different groups are then concatenated, and the concatenated binary code is added to the concatenated error component to generate a final error-free binary count.

For example, the eight-bit ripple counter shown in FIG. 4 is still grouped into 301-303 in the same way as shown in FIG. 3. In group 301, the output bits m(0), s(0) and the inverse of input clock 105 form a three-bit gray-code count, which is converted to a three-bit binary count at the gray-to-binary converter 321. In group 302, the output bits m(1), m(2), s(2) and the inverse of s(0) (which serves as the input clock for group 302) form a four-bit gray-code count and are are converted, via the gray-to-binary converter 322, to a four-bit binary count. In group 303, output bits m(3), . . . m(7) and s(7) and s(2) (which serves as the input clock for group 303) form a seven-bit gray-code count and are converted, via the gray-to-binary converter 323, to a seven-bit binary count. Thus, the LSB of each binary count from the gray-to-binary converter 321, 322 and 323 is designated as the respective error component for the respective group, e.g., see 351, 352 and 353, and are concatenated at the concatenator 341. The MSBs coming out of the gray-to-binary converter 321 and 322 are omitted. The remaining bit (361, 1 bits) from the output bits (excluding the LSB and MSB) of 321 and the remaining bits (362, 2 bits) from the output bits (excluding the LSB and MSB) of 322, each representing the binary count from group 301 and 302, respectively, are sent to concatenator 342. The remaining bits (363, 6 bits) from the output bits (excluding the LSB 353 but including the MSB) of 323 is also sent to the concatenator 342, which is configured to concatenate 361, 362 and 363 to form the concatenated binary count of the counter. The concatenated binary count from the concatenator 342 and the concatenated error component from the concatenator 341 are then added at the adder 410 to generate the error-free binary count 315.

Figure 5:
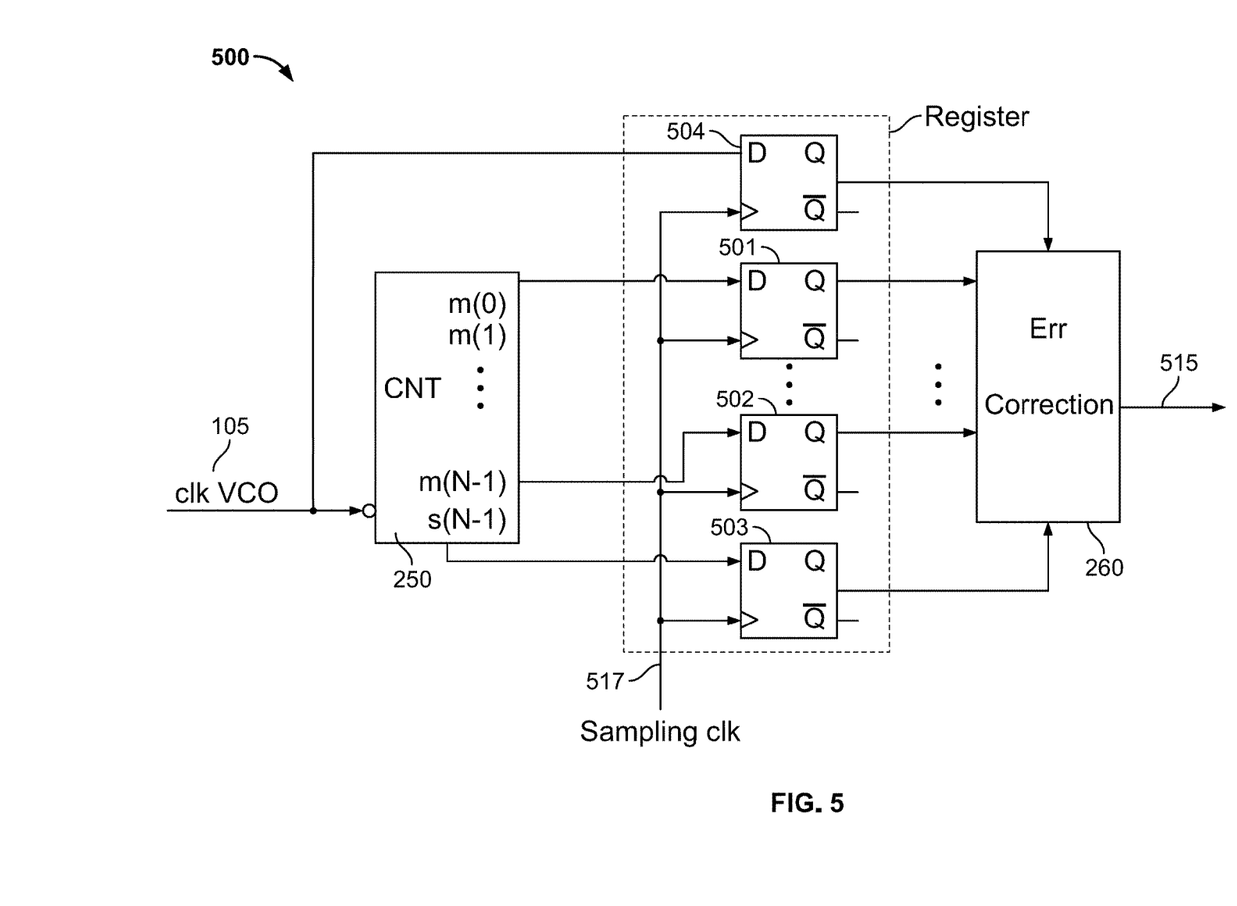
FIG. 5 is a block diagram illustrating an example time-to-digital converter (TDC) implemented by the N-stage ripple counter, according to some embodiments described herein.

Embodiments of the error correction described in relation to FIGS. 1-4 can be applied to a time-to-digital converter (TDC) implemented by an N-stage ripple counter similar to the ripple counter 250 shown in FIGS. 2A-4. FIG. 5 is a block diagram illustrating an example TDC implemented by the N-stage ripple counter, according to some embodiments described herein. For example, the input clock 105 is obtained from a voltage-controlled oscillator (VCO) and input to a counter 250. The counter output bits and the input clock are then sampled by a reference clock, e.g., the sampling clock 517, to obtain a digitized phase relationship between the VCO clock 105 and the reference clock 517. For example, the output bits from the counter 250 and the input clock 105 are then fed to a series of registers 501-504 placed in parallel, and each register 501-504 is controlled by the sampling clock 517. The error correction block 260, which receives the sampled clock from the flip-flop 504, and sampled output bits from flip-flops 501-503, is configured to generate a corrected binary count 515, in a similar manner as described in FIG. 2B.

As the VCO clock 105 is usually in a Giga-Hertz (GHz) range with a short clock period, the longest propagation delay within the multi-bit counter is likely to be greater than a single clock period. For example, if the VCO clock 105 has a frequency of 4 GHz ($T_{IN}$=250 ps), then the propagation delay per stage $T_{delay}$<250/14=17.8 ps (assuming the latches are triggered by both edges of the VCO clock). The propagation delay of a one-bit counter is usually around 100 ps, which does not satisfy the calculated requirement on $T_{delay}$. In addition, as the reference clock 517 is not synchronized with the VCO clock 105, sampling error further contributes to the possible inaccuracy of the TDC.

Thus, by segmenting the multiple stages of the counter 250 into groups, e.g., similar to the way that the eight-stage counter is segmented into groups 301, 302 and 303 as shown in FIGS. 3-4, the propagation delay of each group is less than $T_{IN}/2$. For example, in FIGS. 3-4 in group 301, as the group 301 is triggered by the VCO clock 105, the propagation delay within the group 301, e.g., 100 ps, is less than $T_{IN}/2$=125 ps in the respective example. The group 302 is triggered by the output of the one-bit counter in the group 301, which only changes at half of the frequency of the VCO clock 105, e.g., with a clock period equivalent to $2T_{IN}$. Thus, for the group 302, a two-bit counter that has a propagation delay of $2T_{delay}$ still satisfies the requirement that $2T_{delay}$<$(2T_{IN})/2=T_{IN}$. Similarly, group 303 uses the output from the two-bit counter in group 302 as the clock signal, which only changes at half of the frequency of the clock of group 302 and in turn at a quarter of the frequency of the VCO clock 105. Thus, for the group 303, a four-bit counter that has a propagation delay of $4T_{delay}$ still satisfies the requirement that $4T_{delay}$<$(4T_{IN})/2=2T_{IN}$.

Figure 6:
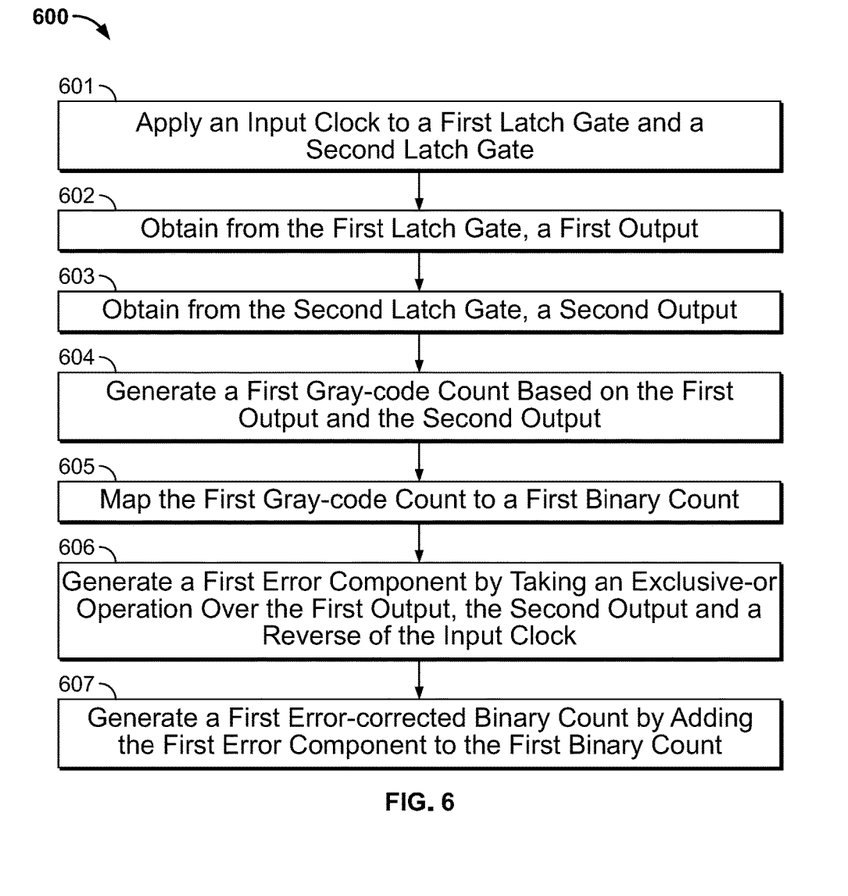
FIG. 6 is a logic flow diagram illustrating an example process of error correction in a one-bit ripple counter as illustrated in FIG. 1, according to some embodiments described herein.

FIG. 6 is a logic flow diagram 600 illustrating an example process of error correction in a one-bit ripple counter as illustrated in FIG. 1, according to some embodiments described herein. At 601, an input clock (e.g., see 105 in FIG. 1) is applied to a first latch gate (e.g., see master latch 101 in FIG. 1) and a second latch gate (e.g., see slave latch 102 in FIG. 1). At 602, a first output (e.g., see m0 104 in FIG. 1) is obtained from the first latch gate. At 603, a second output (e.g., see s(0) 103) is obtained from the second latch gate. At 604, a first gray-code count is generated based on the first output and the second output. At 405, the first gray-code count is mapped to a first binary count (e.g., see 115 in FIG. 1). At 606, a first error component 116 is generated by taking an exclusive-or operation (e.g., see XOR gate 124) over the first output (e.g., see 104 in FIG. 1), the second output (e.g., see 103 in FIG. 1) and a inverse of the input clock (e.g., see 105 in FIG. 1). At 407, a first error-corrected binary count (e.g., see 120 in FIG. 1) is generated by adding the first error component (e.g., see 116 in FIG. 1) to the first binary count (e.g., see 115 in FIG. 1).

Figure 7:
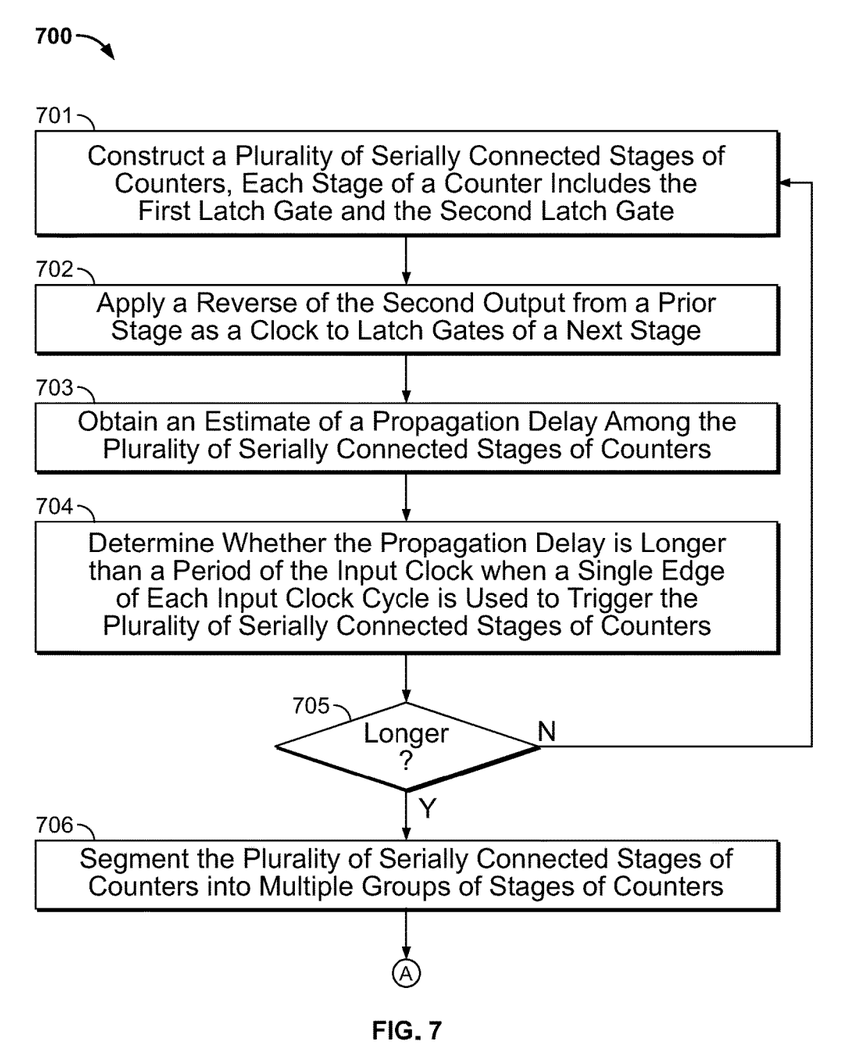
FIG. 7 is a logic flow diagram illustrating an example process of error correction in a multi-bit ripple counter (as illustrated in FIGS. 2A-2C) with segmented error correction (as illustrated in FIG. 3), according to some embodiments described herein.

FIG. 7 is a logic flow diagram illustrating an example process of error correction in a multi-bit ripple counter (as illustrated in FIGS. 2A-2C) with segmented error correction (as illustrated in FIGS. 3-4), according to some embodiments described herein. At 701, a plurality of serially connected stages (e.g., see 201, 202, 203 in FIG. 2B) of counters are constructed. Each stage (e.g., see 201, 202 or 203 in FIG. 2B) of a counter includes the first latch gate and the second latch gate. At 702, an inverse of the second output (e.g., see 205 in FIG. 2B) from a prior stage (e.g., see 201 in FIG. 2B) is applied as a clock to latch gates of a next stage (e.g., see 202 in FIG. 2B). At 703, an estimate of a propagation delay among the plurality of serially connected stages of counters is obtained, e.g., based on a total number of the stages, etc. At 704, it is determined whether the propagation delay is longer than a period of the input clock when a single edge of each input clock cycle is used to trigger the plurality of serially connected stages of counters (or whether the propagation delay is longer than a half of the period of the input clock when both of a rising edge and a falling edge of each input clock cycle are used to trigger the plurality of serially connected stages of counters). At 705, if the propagation delay is longer than the period of the input clock when the single edge of each input clock cycle is used to trigger the plurality of serially connected stages of counters, the plurality of serially connected stages of counters are segmented into multiple groups of stages (e.g., see 301, 302 and 303 in FIG. 3) of counters, at 706. The propagation delay within each group of stages of counters is smaller than the period of the input clock. At 707, for each group of stages of counters, a respective gray-code count is generated by concatenating a bit corresponding to the last output in the group of stages of counters and bits corresponding outputs from other stages in the group of stages of counters at 708. At 709, the respective gray-code count is mapped to a respective binary count. At 710, a respective error component is generated by taking an exclusive-or operation over all bits of the respective gray-code count and the inverse of a clock corresponding to the respective group. At 711, a respective error-corrected binary count is generated by adding the respective error component to the respective binary count. At 712, all respective error-corrected binary counts from the multiple groups of stages of counters are concatenated (e.g., at 310 in FIG. 3) to form a final error-corrected binary count corresponding to the plurality of serially connected stages of counters.

Embodiments described herein include generating an error-corrected binary count from an asynchronous counter. The output of the error-corrected binary count which is synchronized with an input clock to the asynchronous counter may be applied, in an embodiment, as a synchronization clock to different local oscillator paths in oscillator-operated circuits. Further description on phase synchronization of local oscillator paths using a ripple counter output can be found in co-pending and commonly-assigned U.S. application no. Ser. No. 15/812,780, filed on the same day, which is hereby expressly incorporated by reference in its entirety.

Various embodiments discussed in conjunction with FIGS. 1-7 are performed by various electronic components of one or more electronic circuits, such as but not limited to an integrated circuit, DSP, and/or the like. Various components discussed throughout this disclosure such as, but not limited to latches (e.g., 101, 102 in FIG. 1), XOR gates (e.g., 124 in FIG. 1, 224 in FIG. 2B), and/or the like, are configured to include a set of electronic circuit components, and communicatively operate on one or more electronic circuits. Each electronic circuit is configured to include any of, but not limited to logic gates, memory cells, amplifiers, filters, and/or the like. Various embodiments and components disclosed herein are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular example embodiments but other embodiments can be implemented and are within the scope of the following claims. For example, the actions recited in the claims can be performed in a different order and still achieve desirable results. As one example, the process depicted in FIG. 10 does not necessarily require the particular order shown, or sequential order, to achieve desirable results. In certain implementations, multitasking and parallel processing may be advantageous. Other variations are within the scope of the following claims.

What is claimed is:

1. A method for correcting a propagation delay induced error in an output of an asynchronous counter, the method comprising:
   applying an input clock to a gray-code counter;
   generating a gray-code count by the gray-code counter;
   mapping the gray-code count to a binary count;
   generating an error component, indicative of a counting error induced by a propagation delay between the input clock and the binary count, by taking an exclusive-OR operation over the gray-code count and the input clock;
   adding the error component to the binary count to generate an error-corrected binary count; and
   outputting the error-corrected binary count.

2. The method of claim 1, further comprising:
   determining whether a gate propagation delay within the asynchronous counter exists based on a value of the error component; and
   in response to determining that the error component has a value of one:
      determining that the gate propagation delay exists; and
      adding the error component to the binary count to correct the propagation delay.

3. The method of claim 1, wherein the gray-code counter includes a plurality of serially connected stages of counters, further comprising:
   concatenating a plurality of output bits from the plurality of serially connected stages of counters during an instant clock period to form the first gray-code count; and
   performing the exclusive OR operation on the plurality of output bits and the input clock to generate the error component.

4. The method of claim 1, further comprising:
   grouping the gray-code count and the input clock as a concatenated gray-code count;
   converting the concatenated gray-code count to a concatenated binary count;
   designating a least significant bit from the concatenated binary count as the error component; and
   designating remaining bits from the concatenated binary count excluding the least significant bit as the binary count.

5. The method of claim 1, wherein the gray-code counter includes a plurality of serially connected stages of counters, further comprising:
   obtaining an estimate of a propagation delay among the plurality of serially connected stages of counters based on a number of the plurality of serially connected stages of counters;
   determining whether the propagation delay is longer than a period of the input clock when a single edge of each input clock cycle is used to trigger the plurality of serially connected stages of counters; and
   determining whether the propagation delay is longer than a half of the period of the input clock when both of a rising edge and a falling edge of each input clock cycle are used to trigger the plurality of serially connected stages of counters.

6. The method of claim 5, further comprising:
   in response to determining that the propagation delay is longer than the period of the input clock when the single edge of each input clock cycle is used to trigger the plurality of serially connected stages of counters, segmenting the plurality of serially connected stages of counters into multiple groups of stages of counters, wherein a propagation delay within each group of stages of counters is smaller than the period of the input clock.

7. The method of claim 6, further comprising:
   for each group of stages of counters,
      generating a respective gray-code count by concatenating a bit corresponding to a last output in the respective group of stages of counters and bits corresponding to outputs from other stages in the respective group of stages of counters;

mapping the respective gray-code count to a respective binary count; and generating a respective error component, indicative of a respective counting error induced by a respective propagation delay between a respective input and a respective output of the group of stages of counters, by taking an exclusive-OR operation over all bits of the respective gray-code count and the respective input clock that is input to the respective group of stages of counters.

8. The method of claim 7, further comprising:
generating a respective error-corrected binary count by adding the respective error component to the respective binary count; and
concatenating all respective error-corrected binary counts from the multiple groups of stages of counters to form the error-corrected binary count corresponding to the plurality of serially connected stages of counters.

9. The method of claim 7, further comprising:
for respective groups of stages of counters,
grouping the respective gray-code count from the respective group of stages of counters and the input clock as a respective concatenated gray-code count;
converting the respective concatenated gray-code count to a respective concatenated binary count;
designating a least significant bit from the concatenated binary count as a respective error component; and
designating remaining bits from the respective concatenated binary count excluding the least significant bit as the respective binary count;
concatenating all respective binary counts corresponding to all groups of stages of counters to form the binary count; and
concatenating all respective error components corresponding to all groups of stages of counters to form the error component.

10. The method of claim 1, further comprising:
feeding a voltage-controlled oscillator (VCO) generated clock signal as the input clock;
sampling, via a register, the input clock and gray-code count from the gray-code counter based on a reference clock; and
using the sampled gray-code count from the register and from the sampled clock for error correction to generate the error-free binary count.

11. A system for correcting a propagation delay induced error in an output of an asynchronous counter, the system comprising:
a first gray-to-binary count converter configured to:
receive a gray-code count generated by the gray-code counter, wherein the gray-code counter is operated by an input clock,
map the gray-code count to a binary count;
an exclusive OR gate configured to perform an exclusive-OR operation over the gray-code count and the input clock to generate an error component indicative of a counting error induced by a propagation delay between the input clock and the binary count; and
an adder to generate an error-corrected binary count by adding the error component to the binary count.

12. The system of claim 11, further comprising:
circuitry configured to:
determine whether a gate propagation delay exists within the asynchronous counter based on a value of the error component, and
in response to determining that the error component has a value of one:

determine that the gate propagation delay exists, and
add the error component to the binary count to correct the propagation delay.

13. The system of claim 11, wherein the gray-code counter includes a plurality of serially connected stages of counters, further comprising:
a concatenator configured to group a plurality of output bits from the plurality of serially connected stages of counters to form the gray-code count at an instant clock period,
wherein the exclusive or gate is configured to perform the exclusive or operation on the plurality of output bits and the input clock to generate the error component.

14. The system of claim 11, further comprising:
a concatenator that is configured to concatenate the gray-code count and the input clock as a concatenated gray-code count;
a second gray-to-binary count converter that is one-bit larger than the first gray-to-binary count converter, wherein the second gray-to-binary count is configured to convert the concatenated gray-code count to a concatenated binary count,
wherein a least significant bit from the concatenated binary count is provided to the adder as the error component; and
wherein remaining bits from the concatenated binary count excluding the least significant bit are provided to the adder as the binary count.

15. The system of claim 11, wherein the gray-code counter includes a plurality of serially connected stages of counters, and
wherein an estimate of a propagation delay among the plurality of serially connected stages of counters is obtained based on a number of the plurality of serially connected stages of counters, and a determination relating to whether the propagation delay is longer than a period of the input clock is made when a single edge of each input clock cycle is used to trigger the plurality of serially connected stages of counters, or a determination relating to whether the propagation delay is longer than a half of the period of the input clock when both of a rising edge and a falling edge of each input clock cycle are used to trigger the plurality of serially connected stages of counters.

16. The system of claim 15, wherein the circuitry is further configured to:
in response to determining that the propagation delay is longer than the period of the input clock when the single edge of each input clock cycle is used to trigger the plurality of serially connected stages of counters, segment the plurality of serially connected stages of counters into multiple groups of stages of counters,
wherein a propagation delay within each group of stages of counters is smaller than the period of the input clock.

17. The system of claim 16, further comprising:
a respective gray-to-binary count converter for each group of stages of counters, wherein the respective gray-to-binary count converter is configured to receive a respective gray-code count from the respective group of stages of counters and map the respective gray-code count to a respective binary count; and
a respective exclusive OR gate for each group of stages of counters, wherein the respective exclusive OR gate is configured to generate a respective error component, indicative of a respective counting error induced by a respective propagation delay between a respective input and a respective output of the group of stages of counters, by taking an exclusive-OR operation over all bits of the respective gray-code count and the respective input clock that is input to the respective group of stages of counters.

18. The system of claim 17, further comprising:
a respective adder for each group of stages of counters, wherein the respective adder is configured to generate a respective error-corrected binary count by adding the respective error component to the respective binary count; and
a concatenator configured to concatenate all respective error-corrected binary counts from the multiple groups of stages of counters to form the error-corrected binary count corresponding to the plurality of serially connected stages of counters.

19. The system of claim 16, further comprising:
a respective concatenator that is configured to concatenate a respective gray-code count from each group of stages of counters and the input clock as a respective concatenated gray-code count;
a respective gray-to-binary count converter that is configured to convert the respective concatenated gray-code count to a respective concatenated binary count, wherein a least significant bit from the respective concatenated binary count is designated as a respective error component;
wherein remaining bits from the respective concatenated binary count excluding the least significant bit is designated as the respective binary count;
a first concatenator configured to concatenate all respective binary counts corresponding to all groups of stages of counters to form the binary count; and
a second concatenator configured to concatenate all respective error components corresponding to all groups of stages of counters to form the error component.

20. The system of claim 11, wherein the input clock is generated by a voltage-controlled oscillator (VCO), further comprising:
a register configured to receive the gray-code count from the gray-code counter and sample the gray-code count based on a reference clock; and
an error correction module configured to receive the sampled gray-code count from the register and to generate the error-free binary count based on the sampled gray-code count and the reference clock.

* * * * *